(12) United States Patent
Mueller

(10) Patent No.: US 11,495,706 B2
(45) Date of Patent: Nov. 8, 2022

(54) METHOD FOR PRODUCING AN OPTOELECTRONIC COMPONENT, OPTOELECTRONIC COMPONENT, AND IR DETECTOR

(71) Applicant: OSRAM OLED GmbH, Regensburg (DE)

(72) Inventor: Michael Mueller, Garching (DE)

(73) Assignee: OSRAM OLED GMBH, Regensburg (DE)

( * ) Notice: Subject to any disclaimer, the term of this patent is extended or adjusted under 35 U.S.C. 154(b) by 215 days.

(21) Appl. No.: 16/642,333

(22) PCT Filed: Aug. 28, 2018

(86) PCT No.: PCT/EP2018/073138
§ 371 (c)(1),
(2) Date: Feb. 26, 2020

(87) PCT Pub. No.: WO2019/043006
PCT Pub. Date: Mar. 7, 2019

(65) Prior Publication Data
US 2020/0295216 A1    Sep. 17, 2020

(30) Foreign Application Priority Data
Sep. 1, 2017  (DE) .......................... 102017120168.8

(51) Int. Cl.
*H01L 31/09*    (2006.01)
*H01L 31/0203*    (2014.01)
(Continued)

(52) U.S. Cl.
CPC .......... *H01L 31/09* (2013.01); *H01L 31/0203* (2013.01); *H01L 31/02327* (2013.01);
(Continued)

(58) Field of Classification Search
CPC ................. H01L 31/09; H01L 31/0203; H01L 31/02327; H01L 31/173; H01L 31/18;
(Continued)

(56) References Cited

U.S. PATENT DOCUMENTS 9,006,007 B2    4/2015  Schneider
2009/0261358 A1*  10/2009  Chitnis .................. H01L 33/508
257/E33.061
(Continued)

FOREIGN PATENT DOCUMENTS

CN            102412344 A  *  4/2012  ........... B29C 31/045
DE      102013207308 A1    10/2014
EP          2469614 A2     6/2012

*Primary Examiner* — Hoang-Quan Ho
(74) *Attorney, Agent, or Firm* — Slater Matsil, LLP

(57) ABSTRACT

A method for producing an optoelectronic component and an optoelectronic component are disclosed. In an embodiment a method includes providing an optoelectronic semiconductor chip with a radiation passage surface on a connection carrier, applying a deformable spacer to the radiation passage surface of the semiconductor chip, inserting the connection carrier with the semiconductor chip into a cavity of a tool, deforming, by the tool, the deformable spacer and encapsulating the semiconductor chip with a casting compound.

14 Claims, 4 Drawing Sheets

(51) Int. Cl.
*H01L 31/173* (2006.01)
*H01L 31/0232* (2014.01)
*H01L 31/18* (2006.01)
*H01L 33/00* (2010.01)
*H01L 33/48* (2010.01)
*H01L 33/50* (2010.01)
*H01L 33/54* (2010.01)
*H01L 33/58* (2010.01)
*H01L 33/62* (2010.01)

(52) U.S. Cl.
CPC ............ *H01L 31/173* (2013.01); *H01L 31/18* (2013.01); *H01L 33/005* (2013.01); *H01L 33/486* (2013.01); *H01L 33/505* (2013.01); *H01L 33/54* (2013.01); *H01L 33/58* (2013.01); *H01L 33/62* (2013.01)

(58) Field of Classification Search
CPC ... H01L 33/005; H01L 33/486; H01L 33/505; H01L 33/54; H01L 33/58; H01L 33/62; H01L 2933/0025; H01L 2933/0033; H01L 2933/005; H01L 2933/0058; H01L 33/44; H01L 33/46

See application file for complete search history.

(56) References Cited

U.S. PATENT DOCUMENTS

| | | | |
|---|---|---|---|
| 2009/0311485 A1* | 12/2009 | Uchida | H01L 27/14618 428/339 |
| 2012/0077292 A1* | 3/2012 | Chang | H01L 33/52 257/E33.059 |
| 2013/0292553 A1* | 11/2013 | Chang | H01L 31/173 250/216 |
| 2016/0172559 A1 | 6/2016 | Zitzlsperger et al. | |
| 2016/0187483 A1 | 6/2016 | Luan et al. | |
| 2019/0043733 A1* | 2/2019 | Kapusta | H01L 23/3135 |

* cited by examiner

METHOD FOR PRODUCING AN OPTOELECTRONIC COMPONENT, OPTOELECTRONIC COMPONENT, AND IR DETECTOR

This patent application is a national phase filing under section 371 of PCT/EP2018/073138, filed Aug. 28, 2018, which claims the priority of German patent application 102017120168.8, filed Sep. 1, 2017, each of which is incorporated herein by reference in its entirety.

TECHNICAL FIELD

A method of producing an optoelectronic component, an optoelectronic component and an IR detector are specified.

BACKGROUND

Optoelectronic components and methods for their production are described, for example, in U.S. Patent Publication No. 2016/0172559 A1 and German Patent Publication No. 102013207308 A1.

SUMMARY OF THE INVENTION

Embodiments provide a method for encapsulating an optoelectronic semiconductor chip with a casting compound. Further embodiments provide an optoelectronic component with a casting compound and an IR detector.

Advantageous embodiments and further developments of the method, the optoelectronic component and the IR detector are the subject of the respective dependent claims.

According to an embodiment of the method of producing an optoelectronic component, an optoelectronic semiconductor chip with a radiation passage surface is provided. The optoelectronic semiconductor chip is preferably applied on a connection carrier.

According to another embodiment of the method, a deformable spacer is applied to the radiation passage surface of the semiconductor chip.

According to another embodiment of the method, the composite comprising the connection carrier, the semiconductor chip and the deformable spacer is inserted into a cavity of a tool, the tool deforming the deformable spacer. For example, the tool can have two tool halves or consist of two tool halves. For example, the composite comprising the connection carrier, the semiconductor chip and the deformable spacer is inserted into one of the tool halves and the tool is closed with the other tool half, thus creating a closed cavity. When closing the tool, the deformable spacer is preferably deformed. For example, a wall of the second tool half adjoins the deformable spacer and deforms the spacer when the tool is closed. When the tool is closed, the deformable spacer is preferably deformed such that it seals the cavity to the outside. In this way, the burr formation during encapsulation of the semiconductor chip is advantageously at least reduced.

Using the deformable spacer has the advantage that when the spacer is deformed, a good seal is achieved between the tool cavity and the workpiece to be encapsulated. Compared to using a rigid glass plate as a spacer, the use of a deformable spacer has the advantage of being easier to adjust and apply.

According to another embodiment of the method, the semiconductor chip is encapsulated with a casting compound, preferably with the tool cavity being completely closed. For example, the casting compound for encapsulating the semiconductor chip is introduced into the closed cavity of the tool, for example by injection.

According to an embodiment of the method, a housing material is used as the casting compound. For example, an epoxy resin can be used as a casting compound. Preferably the epoxy resin is filled with filler particles. The casting compound can be white or black. Preferably, a white casting compound is used in conjunction with a light-emitting diode chip as the optoelectronic semiconductor chip and a black casting compound is used in conjunction with a photodiode or photo IC as the optoelectronic semiconductor chip.

According to another embodiment of the method, the deformable spacer is applied with the following steps: A drop of a liquid material is formed on the radiation passage surface of the semiconductor chip. Particularly preferably, the drop has a dome-shaped curvature. The liquid material is then cured to form the deformable spacer. For example, the drop of the liquid material is formed by jetting on the radiation passage surface of the semiconductor chip. This method of producing the spacer allows the spacer to be positioned precisely and its shape and size to be determined precisely.

Particularly preferably, the jet process is comparatively fast. The drop of liquid material is preferably applied to the radiation passage surface of the semiconductor chip at a speed of between 5000 units per hour and 10000 units per hour inclusive.

Preferably the drop of liquid material is cured by UV radiation. Curing of the liquid material with the aid of UV radiation can advantageously be carried out particularly quickly, so that the drop does not flow off the semiconductor chip or change its shape undesirably. The UV radiation advantageously fixes the shape of the formed drop.

The material of the deformable spacer is preferably selected to wet the front side of the optoelectronic semiconductor chip in drop form. Particularly preferably, the material of the deformable spacer only partially wets the front side of the semiconductor chip, so that a partial area of the front side remains free of the material of the deformable spacer. For example, the material of the deformable spacer is positioned centrally on the front side of the semiconductor chip. The shape of the deformable spacer is advantageously determined by the shape of the formed drop. In this way, the drop can be prevented in a particularly preferred manner from touching bond wires that are attached to bond pads at least in some corners of the semiconductor chip.

According to another embodiment of the method, the wall of the tool which rests on the deformable spacer and deforms the spacer is planar, particularly preferably completely planar. Particularly preferably, the wall of the tool which rests on and deforms the deformable spacer is free of a spacer structure above the radiation passage surface. Instead of the spacer structure over the radiation passage surface, the deformable spacer is advantageously used to form a recess in the casting compound over the semiconductor chip and in particular over the radiation passage surface of the semiconductor chip. Compared to using a tool with a spacer structure, this has the advantages of being significantly cheaper, being able to be used for different products and allowing for reduced burr formation in case of inaccurate positioning.

In this process, it is particularly preferred not to use a film that at least partially lines the tool, as is the case with film assisted molding (FAM method for short). Particularly preferably, this means that the use of the expensive film can be dispensed with. In the FAM method, the film has the particular task of sealing the workpiece, such as the semiconductor chip, against the tool in order to avoid the formation of burrs.

In addition, the film can prevent the casting compound from sticking to the tool and facilitate demolding of the workpiece. In the method described here, the deformable spacer takes over all these tasks at least partially and preferably completely instead of the film. Furthermore, the method described here has the advantage over the FAM method of forming fewer burrs.

According to another embodiment of the method, the spacer is removed again after the casting compound has been cured. This particularly preferably results in the formation of a recess in the casting compound. Particularly preferably, the recess in the casting compound penetrates the casting compound completely. Preferably, a radiation passage surface of the semiconductor chip is freely accessible through the recess. Preferably the shape of the recess corresponds to the shape of the deformed spacer.

For example, the spacer can be removed from the radiation passage surface by one of the following methods: Rinsing with water or air, etching, pick-and-place process, electrolytic process. Furthermore, it is also possible that the spacer is removed from the radiation passage surface when the tool is opened without further measures.

The spacer can, for example, be removed from the radiation passage surface again with an organic etch, which is selectively corrosive for the spacer material and preferably does not attack the casting compound. For example, a vacuum nozzle can be used in a pick-and-place process to remove the spacer from the radiation passage surface.

According to an embodiment of the method, the recess is filled with a clear casting. For example, the clear casting may be a silicone casting. For example, the recess is completely filled with the clear casting. The clear casting can be flush with a surface of the casting compound. The clear casting advantageously improves the optical coupling of the component to the surrounding medium.

According to another embodiment of the method, the optoelectronic semiconductor chip is a light-emitting diode chip which emits electromagnetic radiation of a first wavelength range from the radiation passage surface. Particularly preferably, the recess in this embodiment is filled with a conversion element which converts electromagnetic radiation of the first wavelength range into electromagnetic radiation of a second wavelength range. The first wavelength range is preferably different from the second wavelength range. The optoelectronic component preferably emits mixed-colored radiation, which is composed of electromagnetic radiation of the first wavelength range and electromagnetic radiation of the second wavelength range. Preferably, the mixed-colored radiation has a color location in the white area of the CIE standard chromaticity diagram.

For example, the light-emitting diode chip emits blue light, which is at least partially converted into yellow light by the conversion element. In this case, the optoelectronic component preferably emits mixed-colored, white radiation, which is composed of blue light and yellow light.

It is also possible that the spacer is intended to remain in the finished component. In this embodiment, the radiation passage surface is particularly preferably formed by an adhesion promoting layer, which improves the adhesion of the semiconductor chip to the spacer. For example, the adhesion promoting layer may comprise hexamethyldisilazane (HDMS) or may consist of hexamethyldisilazane.

For example, the deformable spacer comprises a silicone or is formed from a silicone.

Particularly preferably, the cured material of the deformable spacer has a comparatively high elongation at break.

Preferably, the cured material of the spacer has an adapted modulus of elasticity that is not too low and not too high at the temperature of the encapsulation process with the casting compound, so that cracks in the spacer are avoided during deformation and, in addition, a good sealing of the tool cavity and the semiconductor chip is advantageously possible when encapsulating the semiconductor chip with the casting compound.

According to another embodiment of the method, a plurality of semiconductor chips is encapsulated, preferably one after the other. In this embodiment, a deformable spacer is preferably applied only to those semiconductor chips that are fully functional. For example, the semiconductor chips are electrically contacted with bond wires before being encapsulated with the casting compound and it is tested before encapsulation whether the semiconductor chip is fully functional. This information can, for example, be read out by an electronic error matrix. This embodiment of the method has the advantage that only fully functional components are provided with a spacer, so that defective components can be easily detected and sorted out.

The method described here is particularly suitable for producing an optoelectronic component. Elements, features and embodiments which in the present case are described only in connection with the method may therefore also be present in the optoelectronic component and vice versa. Furthermore, all features described in connection with the optoelectronic component or the method can also be present in the IR detector and vice versa.

The optoelectronic component preferably comprises a connection carrier on which an optoelectronic semiconductor chip with a radiation passage surface is applied. For example, the connection carrier comprises a lead frame or is formed from a lead frame.

According to an embodiment of the optoelectronic component, the semiconductor chip is at least partially encapsulated with a casting compound. Particularly preferably, the casting compound has a recess. The radiation passage surface can be at least partially freely accessible through the recess. An edge of the recess is in this case particularly preferably round. The edge of the recess can be oval or circular, for example. In other words, the edge of the recess is preferably free of corners and edges.

The round edge of the recess can be created in particular by the method described here, in which a deformable spacer is used to create the recess.

According to another embodiment of the optoelectronic component, the casting compound is concave on a lateral surface facing the recess. The concave lateral surface of the casting compound limits the recess preferably. In other words, the lateral surface of the casting compound facing the recess preferably has a curvature, so that the recess has a larger cross-sectional area in a central region than in an edge region. Preferably the lateral surface is concave over its entire surface. The lateral surface is particularly preferred to be concave over its entire surface, the recess having a round edge.

The concave lateral surface of the lateral surface of the casting compound facing the recess can be created in particular by the method described here, in which a deformable spacer is used to create the recess.

Preferably, the casting compound completely encapsulates the semiconductor chip except for the recess. In particular, the casting compound preferably protrudes beyond the front side of the semiconductor chip.

For example, the optoelectronic semiconductor chip can be a light-emitting diode chip, a photodiode chip or a photo IC (IC short for "Integrated Circuit"). A photo IC preferably comprises a photodiode chip and other electronic elements, which are configured, for example, to control the photodiode chip.

The photodiode chip or photo IC preferably has four bond pads, which are arranged on the front side of the photodiode chip. Preferably, one bond pad is arranged in each corner of the front side, wherein the front side of the semiconductor chip is preferably rectangular. It is also possible that the photodiode chip or photo IC has more or less than four bond pads.

The radiation passage surface of the semiconductor chip is particularly preferred to be enclosed by a front side of the semiconductor chip. Preferably the front side of the semiconductor chip is rectangular. The radiation passage surface is particularly preferably centered on the front side. In other words, a center of the front side and a center of the radiation passage surface are preferably arranged on top of each other. Usually, the radiation passage surface is the optically active surface of the semiconductor chip. If the semiconductor chip is a light-emitting diode chip, the electromagnetic radiation generated by the semiconductor chip is emitted from the radiation passage surface. If the optoelectronic semiconductor chip is a photodiode or a photo IC, the radiation passage surface allows the electromagnetic radiation to be detected to enter the semiconductor chip.

The radiation passage surface of a photo IC is preferably centered on the front side of the semiconductor chip and surrounded by an optically inactive surface, preferably completely. For example, the optically inactive surface includes electronic elements such as conductor paths, transistors and circuits. Particularly preferably, the photo IC or photodiode are suitable for detecting electromagnetic radiation from the infrared spectral range. In this embodiment of the optoelectronic component, the casting compound is preferably black. The black casting compound is intended to prevent stray light from being coupled into the semiconductor chip, thus reducing a noise signal and advantageously improving the ratio of noise signal to measurement signal.

According to an embodiment of the optoelectronic component, the front side of the semiconductor chip comprises, in addition to the radiation passage surface, at least two bond pads, which are provided for the electrical contacting of the semiconductor chip. For example, one bond pad each is arranged in at least two corners of the front side of the semiconductor chip. The bond pads are arranged on the optically inactive surface of the front side or at least partially form the optically inactive surface.

If the edge of the recess is round, the minimum distance between the edge of the recess and a center of the bond pad can advantageously be minimized. This has the advantage of increasing the usable area of the radiation passage surface compared to an edge which is rectangular, for example. Particularly preferably, the minimum distance between the edge of the recess and the center of the bond pad is between 100 micrometers and 150 micrometers inclusive.

According to another embodiment of the optoelectronic component, the recess is filled with a deformable spacer having a dome-shaped outer surface. Such a spacer can advantageously be produced in particular with that embodiment of the method in which a drop of a liquid material is formed on the radiation passage surface of the semiconductor chip. The deformable spacer with its dome-shaped outer surface can serve as a lens, for example. For example, the deformable spacer can act as a lens in conjunction with a light-emitting diode chip and influence the radiation characteristics of the light-emitting diode chip in the desired way.

Particularly preferably, the deformable spacer has a round outer surface. For example, the outer surface of the spacer is dome-shaped or ellipsoidal. The outer surface of the spacer is particularly preferred to have no corners and edges. The deformable spacer can, for example, be designed as a dome-like cupola. In this case, the extent of the recess is usually determined by the size of the deformed spacer. The edge of the recess corresponds particularly preferably to the outer surface of the spacer. The size and the extent as well as the arrangement of the spacer can advantageously be adjusted particularly precisely during production, for example, by jetting a drop of liquid material and freezing it by curing it with UV radiation.

The optoelectronic component described here is particularly suitable for being used in an IR detector. In particular, the optoelectronic component has at least one photodiode or photo IC as an optoelectronic semiconductor chip. The IR detector and the optoelectronic semiconductor chip are particularly suitable for detecting infrared radiation.

The method described here is based, among other things, on the idea of using a deformable dome-like spacer with a curved outer surface instead of a film in an FAM method. This has the advantage that, due to the curved shape of the spacer, the usable area of the radiation passage surface is increased compared to a rectangular surface, as can be achieved, for example, by using a rigid glass plate as a spacer or a structured tool. Furthermore, an expensive film as in the FAM method is not necessary, as the functions of the film are partially or completely taken over by the deformable spacer. Compared to the use of a film as in the FAM method, the dome-like deformable spacer can also compensate for greater heights within the workpiece to be encapsulated. Advantageously, the method described here can be used to compensate for a height difference within the workpiece to be encapsulated of up to about 30 micrometers, whereas conventional methods using a rigid glass plate or film only allow compensation of a height difference of up to about 10 micrometers.

BRIEF DESCRIPTION OF THE DRAWINGS

Further advantageous embodiments and developments will become apparent from the exemplary embodiments described below in connection with the figures.

By means of the schematic illustrations of FIGS. 1 to 5, a method according to a first exemplary embodiment is explained in more detail;

Figure 6:
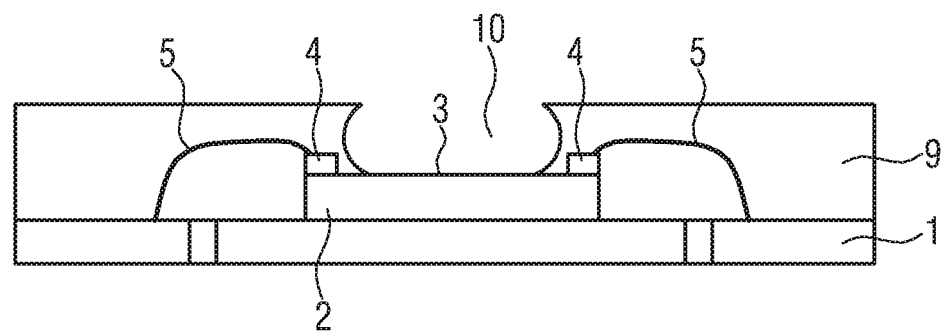
Figure 7:
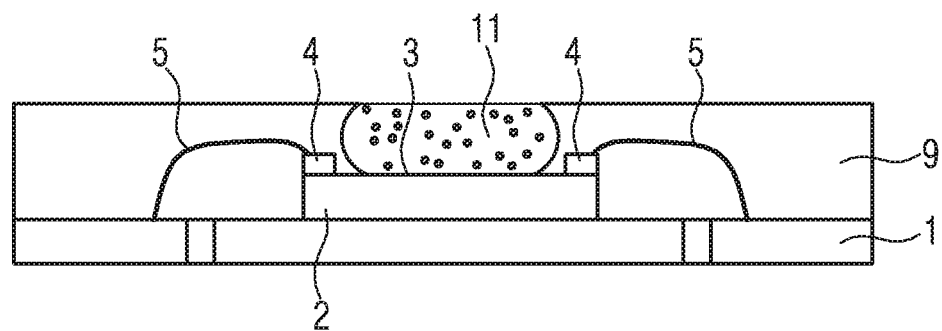
Figure 8:
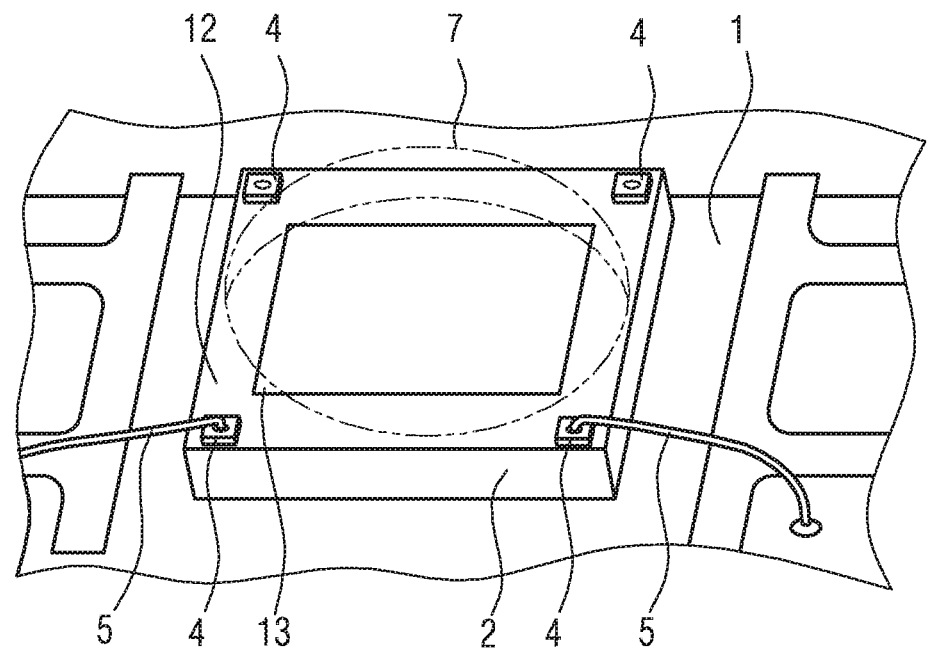

The schematic sectional views of FIGS. 6 and 7 show an optoelectronic component according to one exemplary embodiment each; and The schematic perspective illustration in FIG. 8 shows an IR detector according to an exemplary embodiment.

Equal or similar elements as well as elements of equal function are provided with the same reference signs in the figures. The figures and the mutual proportions of the elements depicted in the figures are not to be considered as true to scale. Rather, individual elements, in particular layer thicknesses, may be shown in an exaggerated size for better representation and/or understanding.

DETAILED DESCRIPTION OF ILLUSTRATIVE EMBODIMENTS

In the method according to the exemplary embodiment shown in FIGS. 1 to 5, a connection carrier 1 is provided in a first step, on which an optoelectronic semiconductor chip 2 is applied. The connection carrier 1 in the present case is a lead frame, while the semiconductor chip 2 is designed as a photodiode chip.

The optoelectronic semiconductor chip 2 has a rectangular front side that comprises a radiation passage surface 3 at the center and four bond pads 4, one in each corner (see also FIG. 8). The bond pads 4 are electrically connected to the lead frame with bond wires 5. The radiation passage surface 3 of the semiconductor chip 2 is surrounded by an optically inactive surface 12, on which the bond pads 4 are arranged.

Figure 1:
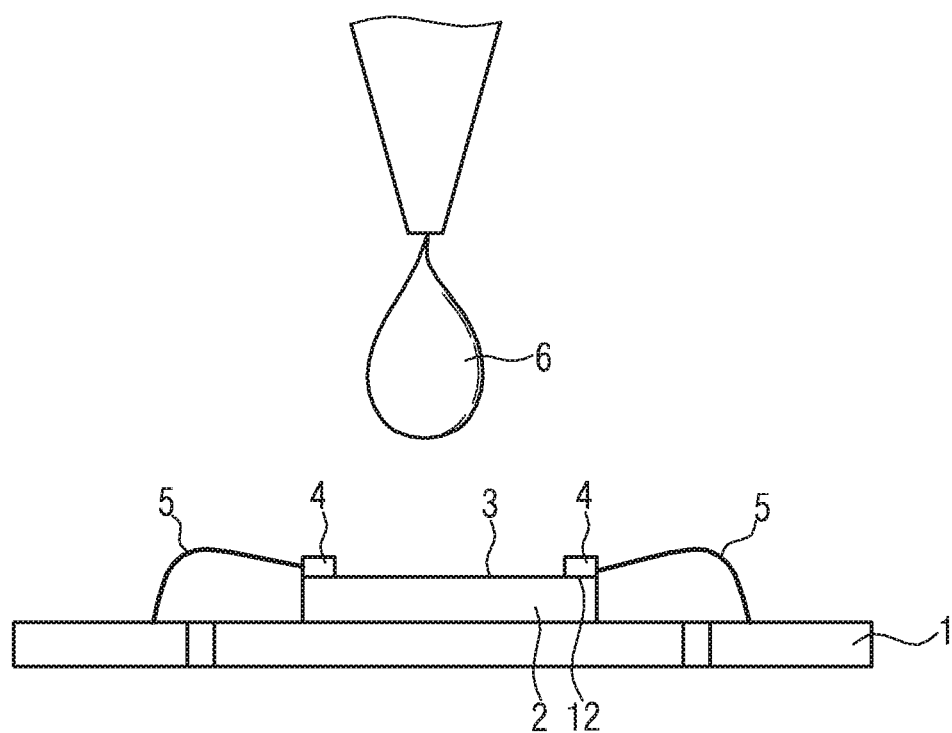
Figure 2:
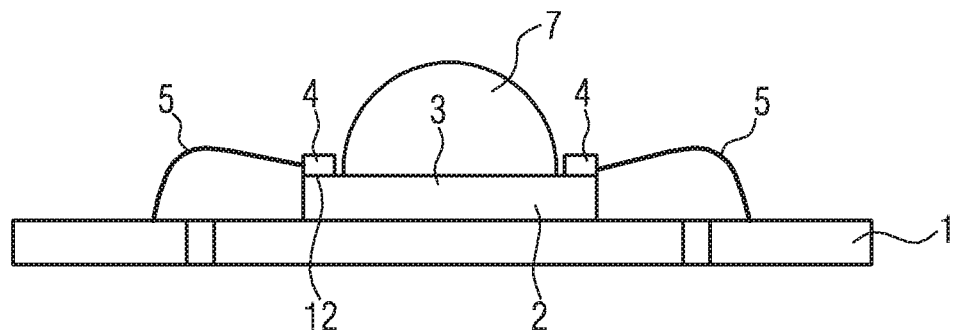

In a next step, which is illustrated schematically in FIG. 1, a drop 6 of a liquid material, for example, a silicone, is formed by jetting onto the radiation passage surface 3 of the optoelectronic semiconductor chip 2. The liquid material wets the radiation passage surface 3 of the semiconductor chip 2 in such a way that the drop 6 is formed with a dome-shaped curvature on the radiation passage surface 3 (FIG. 2). Then the drop 6 is cured, for example, by means of UV radiation, so that a deformable spacer 7 is formed on the radiation passage surface 3 of the optoelectronic semiconductor chip 2.

Figure 3:
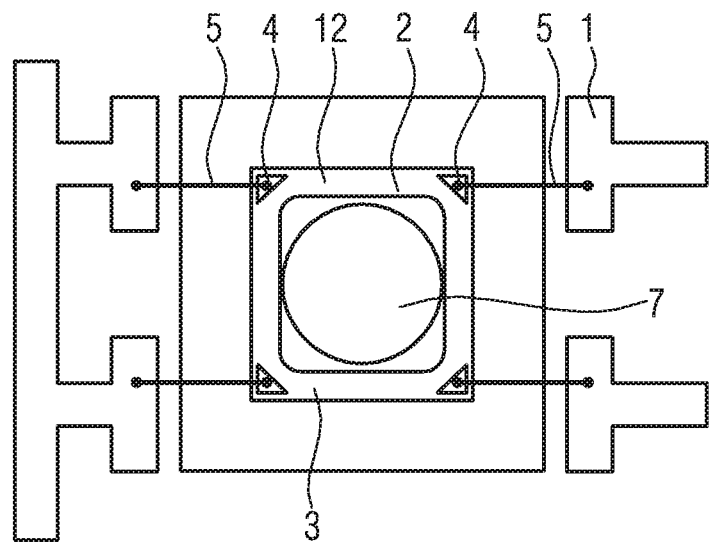

A top view onto the composite of lead frame 1, semiconductor chip 2 and deformable spacer 7 of FIG. 2 is also shown in the top view of FIG. 3. The edge of the radiation passage surface 3 of the optoelectronic semiconductor chip 2 is represented by a closed line in FIG. 3. The radiation passage surface 3 has essentially a rectangular shape with rounded corners. The deformable spacer 7 has a round, in this case circular, edge. The deformable spacer 7 is applied in this case centered on the radiation passage surface 3 of the semiconductor chip 2. The radiation passage surface 3 is completely surrounded by the optically inactive surface 12.

Figure 4:
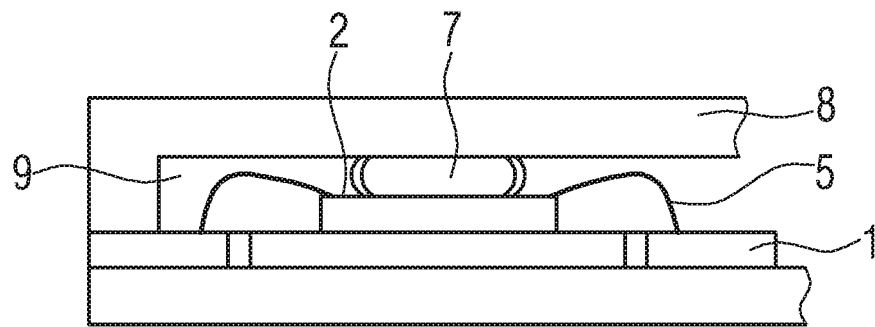
Figure 5:
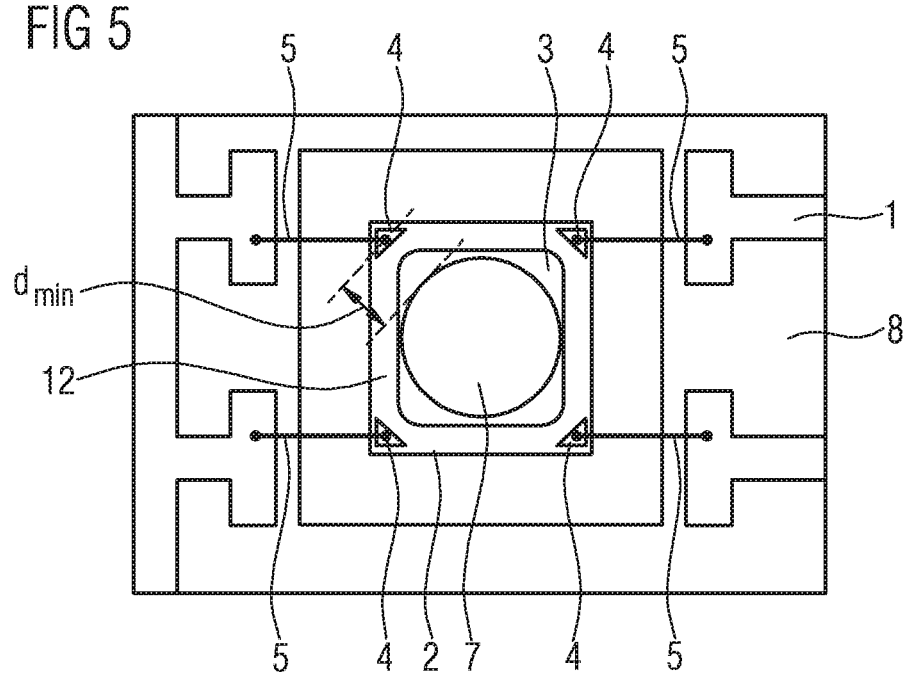

In a next step, which is illustrated schematically in FIGS. 4 and 5, the composite of lead frame 1, semiconductor chip 2 and spacer 7 is inserted in a tool 8. The tool 8 is closed, creating a closed tool cavity. When the tool 8 is closed, the spacer 7 is deformed such that the tool cavity is sealed. The wall of the tool 8 which deforms the spacer 7 is completely planar in this case. Then, as illustrated schematically in FIG. 4, a casting compound 9 is introduced into the cavity of the tool 8 so that the spacer 7 and the semiconductor chip 2 together with the bond wires 5 are completely encapsulated by the casting compound 9.

FIG. 5 schematically shows a top view of the method stage as shown in FIG. 4. In the top view of FIG. 5 the minimum distance $d_{min}$ between the bond pads 4 in one corner each of the front side of the semiconductor chip 2 and the outer surface of the spacer 7 is drawn. This minimum distance $d_{min}$ can advantageously be made comparatively small in the present method. The minimum distance $d_{min}$ between the center of the bond pad 4 and the outer surface of spacer 7 is preferably between 100 micrometers and 150 micrometers inclusive.

In a next step, which is not shown here, the component is demolded from the tool 8.

The spacer 7 can remain in the component or be removed from the component, for example, by means of water rinsing, etching, a pick-and-place process or an electrolytic process. It is also possible that the spacer 7 is removed from the radiation passage surface 3 without additional measures when the component is demolded from the tool 8.

The component according to the exemplary embodiment of FIG. 6 comprises a connection carrier 1 with a lead frame. An optoelectronic semiconductor chip 2, for example, a light-emitting diode chip with two bond pads 4 on its front side, is applied on the connection carrier 1. The bond pads 4 are each electrically connected to the lead frame with a bond wire 5.

The semiconductor chip 2 and the bond wires 5 are encapsulated with a casting compound 9. The casting compound 9 has a recess 10, which has a round, preferably circular, edge. The recess 10 allows free access to the radiation passage surface 3 of the light-emitting diode chip. The recess 10 is preferably centered on the radiation passage surface 3 of the semiconductor chip 2.

In contrast to the optoelectronic component according to FIG. 6, the optoelectronic component according to the exemplary embodiment of FIG. 7 comprises a conversion element 11, which completely fills the recess 10 in the casting compound 9. The conversion element 11 is suitable for at least partially converting electromagnetic radiation of a first wavelength range emitted by the light-emitting diode chip during operation from the radiation passage surface 3 into radiation of a second wavelength range. Preferably, the casting compound 9 in this exemplary embodiment is white to increase the efficiency of the component. Instead of a conversion element 11, the optoelectronic component can also have a clear casting which preferably fills the recess 10 completely.

The IR detector according to the exemplary embodiment of FIG. 8 comprises an optoelectronic component which still includes the spacer 7. The component of the IR detector according to the exemplary embodiment of FIG. 8 comprises a photo IC chip with a photodiode. The photodiode is located centrally on the radiation exit surface of the semiconductor chip and is completely surrounded by the optically inactive surface 12. The photodiode is suitable for detecting infrared radiation. The casting compound 9 is black in this component.

The optoelectronic semiconductor chip 2 of the component as shown in FIG. 8 also has an edge length of approximately 1.4 millimeters and a rectangular radiation passage surface 3 with a size of approximately 1 square millimeter. In the exemplary embodiment of FIG. 8, the radiation passage surface 3 of the semiconductor chip 2 can be formed by an adhesion promoting layer 13, which increases the adhesion of the spacer 7 to the semiconductor chip 2.

The invention is not limited to the exemplary embodiments by the description of the same. Rather, the invention comprises any new feature as well as any combination of features, which includes in particular any combination of features in the claims, even if this feature or combination itself is not explicitly stated in the claims or exemplary embodiments.

The invention claimed is:

1. A method for producing an optoelectronic component, the method comprising:
    providing an optoelectronic semiconductor chip with a radiation passage surface on a connection carrier;
    applying a deformable spacer to the radiation passage surface of the semiconductor chip;
    inserting the connection carrier with the semiconductor chip into a cavity of a tool;
    deforming, by the tool, the deformable spacer;
    encapsulating the semiconductor chip with a casting compound; and
    removing the deformable spacer after curing the casting compound so that a recess is formed in the casting compound.

2. The method according to claim 1, wherein applying the deformable spacer comprises:

forming a drop of a liquid material on the radiation passage surface of the semiconductor chip, the drop having a dome-shaped curvature; and curing the liquid material so that the deformable spacer is formed.

3. The method according to claim 2, wherein the drop is formed by jetting.

4. The method according to claim 2, wherein the liquid material is cured by UV radiation.

5. The method according to claim 1, wherein deforming the deformable spacer comprises resting a planar wall of the tool on the deformable spacer.

6. The method according to claim 1, wherein removing the deformable spacer comprises water rinsing, etching, a pick-and-place process, or an electrolytic process.

7. The method according to claim 1, further comprising filling the recess with a clear casting.

8. The method according to claim 1, further comprising
forming the radiation passage surface by an adhesion promoting layer,
wherein the adhesion promoting layer improves adhesion of the semiconductor chip to the deformable spacer.

9. A method for producing an optoelectronic component, the method comprising:
providing an optoelectronic semiconductor chip with a radiation passage surface on a connection carrier;
applying a deformable spacer to the radiation passage surface of the semiconductor chip;
inserting the connection carrier with the semiconductor chip into a cavity of a tool;
deforming, by the tool, the deformable spacer;
encapsulating the semiconductor chip with a casting compound,
wherein a plurality of semiconductor chips is encapsulated and the deformable spacer is applied only to semiconductor chips which are fully functional; and
curing the deformable spacer before deforming the spacer with the tool.

10. A method for producing an optoelectronic component, the method comprising:
providing an optoelectronic semiconductor chip with a radiation passage surface on a connection carrier;
applying a deformable spacer to the radiation passage surface of the semiconductor chip;
inserting the connection carrier with the semiconductor chip into a cavity of a tool;
deforming, by the tool, the deformable spacer; and
encapsulating the semiconductor chip with a casting compound,
wherein applying the deformable spacer comprises:
forming a drop of a liquid material on the radiation passage surface of the semiconductor chip, the drop having a dome-shaped curvature, and
curing the liquid material so that the deformable spacer is formed, and
wherein the deformable spacer is cured before being deformed with the tool.

11. The method according to claim 10, wherein the drop is formed by jetting.

12. The method according to claim 10, wherein the liquid material is cured by UV radiation.

13. The method according to claim 10, wherein deforming the deformable spacer comprises resting a planar wall of the tool on the deformable spacer.

14. The method according to claim 10, further comprising:
forming the radiation passage surface by an adhesion promoting layer,
wherein the adhesion promoting layer improves adhesion of the semiconductor chip to the deformable spacer, and
wherein the deformable spacer is intended to remain in the finished component.

* * * * *